United States Patent
Mayer et al.

(10) Patent No.: US 9,008,252 B2
(45) Date of Patent: Apr. 14, 2015

(54) CIRCUIT, METHOD AND MOBILE COMMUNICATION DEVICE

(71) Applicants: Thomas Mayer, Linz (AT); Christian Wicpalek, Puchenau (AT); Stefan Tertinek, Linz (AT)

(72) Inventors: Thomas Mayer, Linz (AT); Christian Wicpalek, Puchenau (AT); Stefan Tertinek, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/650,848

(22) Filed: Oct. 12, 2012

(65) Prior Publication Data

US 2014/0105343 A1    Apr. 17, 2014

(51) Int. Cl.
*H04L 7/00* (2006.01)
*H03L 7/00* (2006.01)
*H03C 3/09* (2006.01)

(52) U.S. Cl.
CPC .......... *H04L 7/0016* (2013.01); *H03L 7/00* (2013.01); *H03C 3/0925* (2013.01); *H03C 3/0941* (2013.01); *H03C 3/0975* (2013.01)

(58) Field of Classification Search
CPC ........................................... H03L 7/081
USPC ................................. 375/371, 354
See application file for complete search history.

(56) References Cited

U.S. PATENT DOCUMENTS

| | | | |
|---|---|---|---|
| 5,802,451 A * | 9/1998 | Adachi et al. ............... | 455/126 |
| 2001/0015673 A1 * | 8/2001 | Yamashita et al. ........... | 330/52 |
| 2005/0031341 A1 * | 2/2005 | Stuart ............................ | 398/26 |
| 2005/0033526 A1 * | 2/2005 | Mcneilage et al. ........... | 702/32 |
| 2010/0056091 A1 * | 3/2010 | Jang et al. ................... | 455/226.1 |
| 2010/0310031 A1 | 12/2010 | Ballantyne et al. | |
| 2013/0093480 A1 * | 4/2013 | Staszewski et al. ........... | 327/156 |
| 2013/0223564 A1 | 8/2013 | Mayer et al. | |

FOREIGN PATENT DOCUMENTS

EP     1063766 A2    12/2000

OTHER PUBLICATIONS

Boos, Z.; Menkhoff, A.; Kuttner, F.; Schimper, M.; Moreira, J.; Geltinger, H.; Gossmann, T.; Pfann, P.; Belitzer, A.; Bauernfeind, T.; , "A fully digital multimode polar transmitter employing 17b RF DAC in 3G mode," Solid-State Circuits Conference Digest of Technical Papers (ISSCC), 2011 IEEE International , vol., No., pp. 376-378, Feb. 20-24, 2011 URL: http://ieeexplore.ieee.org/stamp/stamp.jsp?tp=&arnumber=5746361&isnumber=5746170.

(Continued)

*Primary Examiner* — Michael Neff
(74) *Attorney, Agent, or Firm* — Eschweiler & Associates, LLC

(57) ABSTRACT

A circuit includes an oscillator, a variable phase adjuster and a feedback loop. The oscillator is configured to provide an RF signal, wherein the oscillator is configured to operate in a free-running mode of operation. The variable phase adjuster is configured to provide a phase adjusted signal, a phase of which is shifted with respect to a phase of an output signal of the oscillator, or with respect to a phase of a signal derived from the output signal of the oscillator. The feedback loop is configured to provide a control value for controlling the variable phase adjuster based on the phase adjusted signal and a reference oscillator signal to counteract a phase error of the phase adjusted signal.

21 Claims, 6 Drawing Sheets

(56) References Cited

OTHER PUBLICATIONS

Staszewski, R.B.; Wallberg, J.; Rezeq, S.; Chih-Ming Hung; Eliezer, O.; Vemulapalli, S.; Fernando, C.; Maggio, K.; Staszewski, R.; Barton, N.; Meng-Chang Lee; Cruise, P.; Entezari, M.; Muhammad, K.; Leipold, D.; , "All-digital PLL and GSM/EDGE transmitter in 90nm CMOS," Solid-State Circuits Conference, 2005. Digest of Technical Papers. ISSCC. 2005 IEEE International , vol., No., pp. 316-600 vol. 1, Feb. 10-10, 2005 URL: http://ieeexplore.ieee.org/stamp/stamp.jsp?tp=&arnumber=1493996&isnumber=32118.

Youssef, M.; Zolfaghari, A.; Darabi, H.; Abidi, A.; , "A low-power wideband polar transmitter for 3G applications," Solid-State Circuits Conference Digest of Technical Papers (ISSCC), 2011 IEEE International , vol., No., pp. 378-380, Feb. 20-24, 2011 URL: http://ieeexplore.ieee.org/stamp/stamp.jsp?tp=&arnumber=5746362&isnumber=5746170.

Nidhi, N.; Pin-En Su; Pamarti, S.; , "Open loop modulation techniques for wide bandwidth digital frequency synthesis," Circuits and Systems (MWSCAS), 2011 IEEE 54th International Midwest Symposium on , vol., No., pp. 1-4, Aug. 7-10, 2011 URL: http://ieeexplore.ieee.org/stamp/stamp.jsp?tp=&amumber=6026303&isnumber=6026262.

Pin-En Su; Pamarti, S.; "A 2.4 GHz Wideband Open-Loop GFSK Transmitter With Phase Quantization Noise Cancellation," Solid-State Circuits, IEEE Journal of , vol. 46, No. 3, pp. 615-626, Mar. 2011 URL: http://ieeexplore.ieee.org/stamp/stamp.jsp?tp=&arnumber=5686880&isnumber=5718244.

Ravi, A.; Madoglio, P.; Verhelst, M.; Sajadieh, M.; Aguirre, M.; Xu, H.; Pellerano, S.; Lomeli, I.; Zarate, J.; Cuellar, L.; Degani, O.; Lakdawala, H.; Soumyanath, K.; Palaskas, Y.; , "A 2.5GHz delay-based wideband OFDM outphasing modulator in 45nm-LP CMOS," VLSI Circuits (VLSIC), 2011 Symposium on , vol., No., pp. 26-27, Jun. 15-17, 2011 URL: http://ieeexplore.ieee.org/stamp/stamp.jsp?tp=&arnumber=5986407&isnumber=5985982.

Office Action dated Jul. 16, 2014 for co-pending German application No. 10 2013 111 250.1.

\* cited by examiner

CIRCUIT, METHOD AND MOBILE COMMUNICATION DEVICE

FIELD

The present invention relates to a circuit and a mobile communication device. Furthermore, the present invention relates to a method for providing a phase adjusted signal.

BACKGROUND

Currently, a key issue in the phase path of polar modulators, is the gain variation as well as the nonlinear tuning characteristic of the tunable oscillator (e.g. digitally controlled oscillator, DCO). Especially for wideband modulation signals, the implementation of a very linear DCO gets difficult due to the intrinsic nonlinear characteristic given by the typically used 1/sqrt(LC) frequency function. However, also when used as a frequency synthesizer, the DCO nonlinearity and the large gain variation lead to unwanted degradation of the PLL output signal quality (such as EVM or Error Vector Magnitude and phase noise). Additionally, temperature drifts of the DCO frequency have to be covered by the fine tuning range, which increases the required linear range of the DCO tuning input.

To guarantee a well defined loop gain, the DCO gain can be compensated by a digital gain. However, the gain has to be measured on-chip in order to have an actual value for the current process, temperature and supply voltage conditions. For continuously running systems like UMTS or LTE, this becomes even more difficult as the gain usually drifts when the temperature changes, and thus a one-time measurement can be insufficient. Especially when used in a polar modulator, the very stringent requirement on modulation gain requires a continuous tracking of the DCO gain during system operation. This leads to additional power and area consumption for the required circuitry.

To compensate for a DCO tuning nonlinearity, a linearization can be done either at the DCO circuit or at the digital tuning data. However, this adds significant complexity to the PLL circuit, resulting in higher power consumption and long implementation times for the oscillator circuits.

In a rather new development, the phase modulation is added after the PLL by using a digital-to-time converter (DTC). This improves the modulation linearity, as DTCs are usually more linear compared to DCOs. Also, the gain can be defined quite well, if for example the DTC uses a DLL (Delay Locked Loop) to generate the phase delay. This enables polar modulation of very wideband standards like LTE-Advanced, as for DCO-based modulators, a very large modulation frequency range is difficult to achieve. However, as the unmodulated carrier is generated by a conventional PLL, the problems of the frequency synthesizer remain.

Therefore, conventional systems are disadvantageous in that a problem of a nonlinearity and a gain variation arises for both the frequency synthesizer and the phase modulator.

SUMMARY

The present invention relates to a circuit comprising an oscillator, a variable phase adjuster and a feedback loop. The oscillator is configured for providing an RF signal, wherein the oscillator is configured to operate in a free-running mode of operation. The variable phase adjuster is configured to provide a phase adjusted signal, a phase of which is shifted with respect to a phase of an output signal of the oscillator, or with respect to a phase of a signal derived from the output signal of the oscillator. The feedback loop is configured to provide a control value for controlling the variable phase adjuster based on the phase adjusted signal and a reference oscillator signal to counteract a phase error of the phase adjusted signal.

Furthermore, the present invention relates to a circuit comprising an oscillator, a digitally controlled phase shifting device (e.g., DTC) and a feedback loop. The oscillator is configured to provide an RF signal, wherein the oscillator is configured to operate in a free-running mode of operation. The digitally controlled phase shifting device is configured to delay the output signal of the oscillator or the signal derived from the output signal of the oscillator by a variable time delay based on a digital control value to obtain a phase adjusted signal. The feedback loop comprises a divider, a time-to-digital converter (TDC) and a loop filter. The divider is configured to provide a frequency-divided signal using the phase adjusted signal. The time-to-digital converter (TDC) is configured to compare the reference oscillator signal and the frequency-divided signal and to provide a phase error signal in a digital form based on the comparison. The loop filter is configured to filter the phase error signal to obtain a filtered phase error signal. The feedback loop is configured to provide the digital control value for the digitally controlled phase shifting device (DTC) using the filtered phase error signal.

Furthermore, the present invention relates to a mobile communication device comprising an antenna, a circuit and a digital baseband processor. The circuit comprises an oscillator, a variable phase adjuster and a feedback loop. The oscillator is configured to provide an RF signal, wherein the oscillator is configured to operate in a free-running mode of operation. The variable phase adjuster is configured to provide a phase adjusted signal, a phase of which is shifted with respect to a phase of an output signal of the oscillator, or with respect to a phase of a signal derived from the output signal of the oscillator. The feedback loop is configured to provide a control value for controlling the variable phase adjuster based on the phase adjusted signal and a reference oscillator signal to counteract a phase error of the phase adjusted signal. The circuit is coupled between the antenna and the digital baseband processor.

Furthermore, the present invention relates to a method comprising providing an RF signal by an oscillator, wherein the oscillator is configured to operate in a free-running mode of operation, providing a phase adjusted signal, a phase of which is shifted with respect to a phase of an output signal of the oscillator, or with respect to a phase of a signal derived from the output signal of the oscillator, using a variable phase adjustment, and providing a control value for controlling the variable phase adjustment based on the phase adjusted signal and a reference oscillator signal to counteract a phase error of the phase adjusted signal.

BRIEF DESCRIPTION OF THE DRAWINGS

The present invention will be subsequently described taking reference to the enclosed figures in which.

DETAILED DESCRIPTION

Figure 1A:
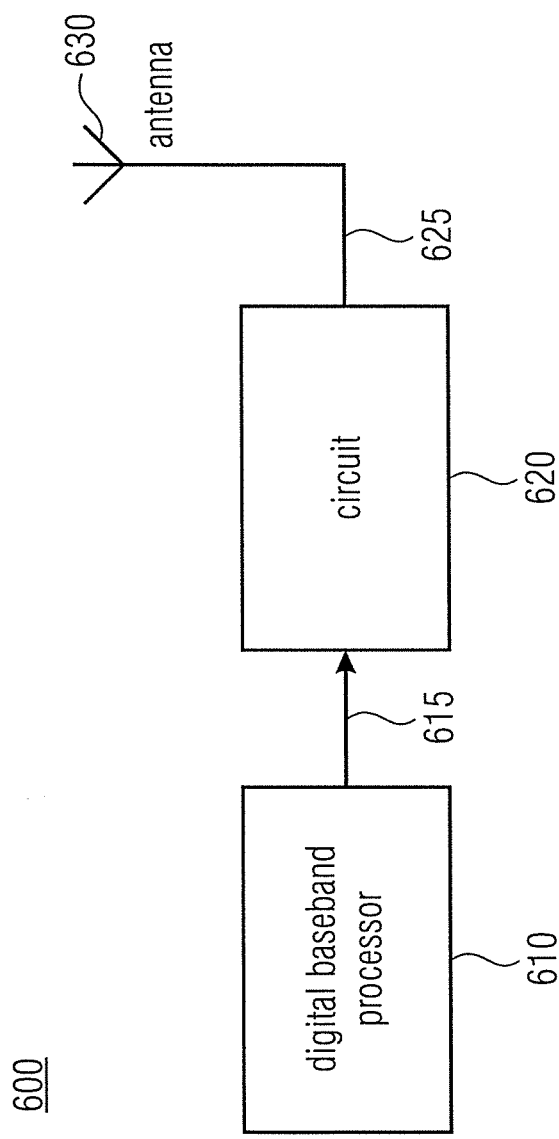
FIG. 1a shows a block diagram of an example mobile communication device.

Before discussing the present invention in further detail using the drawings, it is pointed out that in the figures, identical elements, elements having the same function or the same effect are provided with same reference numerals so that the description of these elements and the functionality thereof illustrated in the different embodiments is mutually exchangeable or may be applied to one another in the different embodiments.

FIG. 1a shows a block diagram of an example mobile communication device 600. As shown in FIG. 1a, the mobile communication device 600 comprises a digital baseband processor 610, a circuit 620 and an antenna 630. The circuit 620 is coupled between the antenna 630 and the digital baseband processor 610. For example, the digital baseband processor 610 is configured to provide a circuit input signal 615. In addition, the antenna 630 is configured to relay an output signal 625 provided by the circuit 620. For example, the circuit 620 shown in FIG. 1a may correspond to one of the circuits described herein.

The mobile communication device 600 may be a portable mobile communication device.

As an example, the mobile communication device 600 can be configured to perform a voice and/or data communication (according to a mobile communication standard) with another (portable) communication device and/or a mobile communication base station. Such a mobile communication device may be, for example, a mobile handset such as a mobile phone (cell phone), a smart phone, a tablet PC, a broadband modem, a notebook or a laptop, as well as a router, a switch, a repeater or a PC. Furthermore, such a mobile communication device may be a mobile communication base station.

The circuit 620 allows avoiding the problem of the nonlinearity and the gain variation in the mobile communication device 600. For example, the circuit 620 can be used to counteract phase errors or phase fluctuations and to attenuate the oscillator noise in the mobile communication device 600.

Although in FIG. 1a the circuit 620 is presented as part of the mobile communication device 600, the circuit 620 may also be used in other circuits or devices. In the following, different examples of such a circuit will be described in more detail.

The conventional systems have the disadvantage of the nonlinearity/gain variation problem for both the frequency synthesizer and the phase modulator. Therefore, a need exists to provide an improved circuit avoiding this problem.

Accordingly, it has been found that the nonlinearity/gain variation problem can be avoided by using a feedback loop (such as a PLL) and an oscillator which operates in a free-running mode of operation. By using the feedback loop or PLL, it is possible to attenuate the oscillator inband noise by means of a negative feedback of the output phase error measured by a phase detector or a time-to-digital converter (TDC). However, it has been found that the oscillator does not have to be in the loop to achieve this when, for example, a digitally controlled phase shifting device (DTC) is available.

Figure 1B:
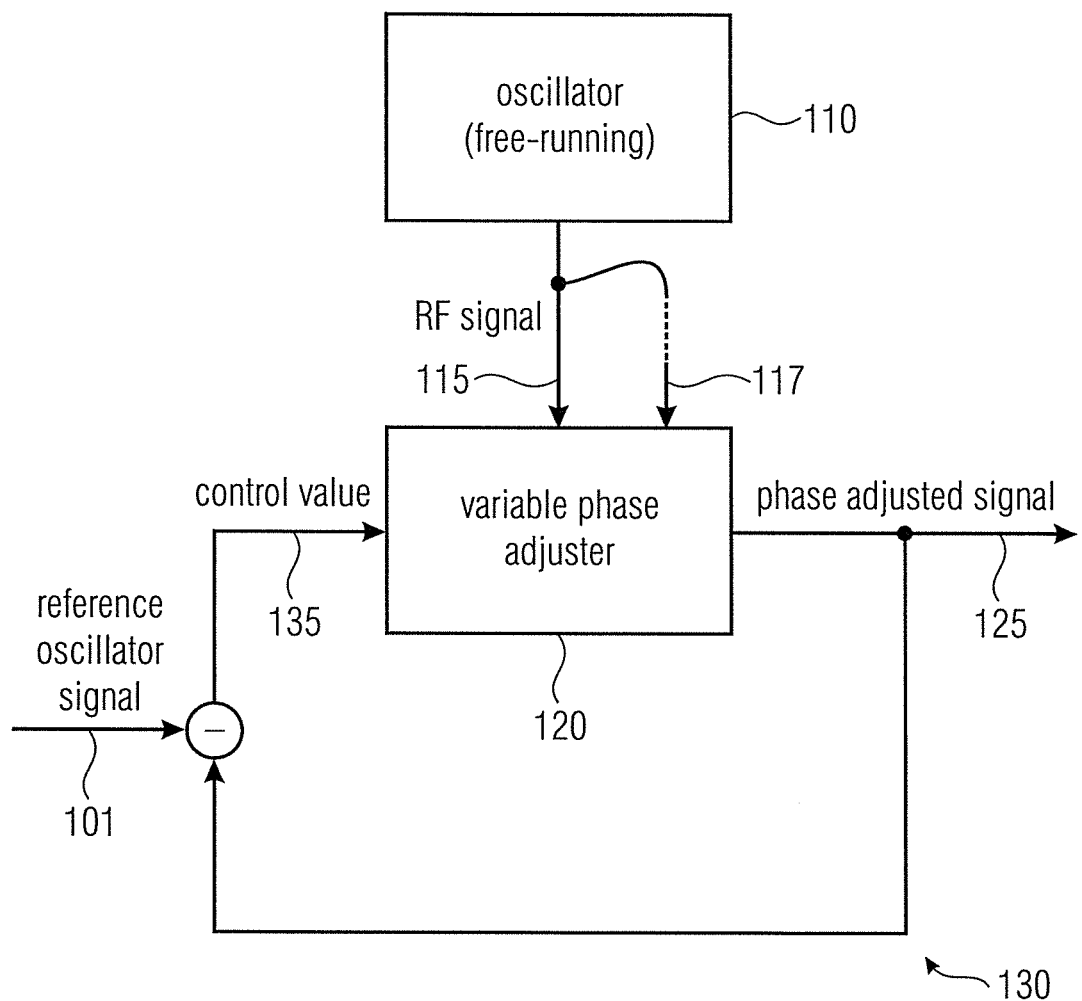
FIG. 1b shows a block diagram of an example circuit comprising a free-running oscillator.

FIG. 1b shows a block diagram of an example circuit 100 comprising a free-running oscillator 110. As shown in FIG. 1b, the circuit 100 comprises an oscillator 110, a variable phase adjuster 120 and a feedback loop 130. The oscillator 110 is configured to provide an RF signal 115. Here, the oscillator 110 is configured to operate in a free-running mode of operation. The variable phase adjuster 120 is configured to provide a phase adjusted signal 125, a phase of which is shifted with respect to a phase of an output signal 115 of the oscillator 110, or with respect to a phase of a signal 117 derived from the output signal 115 of the oscillator 110. The feedback loop 130 is configured to provide a control value 135 for controlling the variable phase adjuster 120 based on the phase adjusted signal 125 and a reference oscillator signal 101 to counteract a phase error of the phase adjusted signal 125. By counteracting the phase error of the phase adjusted signal 125, it is possible to avoid a degradation of the quality of the phase adjusted signal 125 at the output of the feedback loop 130 or the circuit 100. Therefore, the quality of the output signal of the circuit 100 can substantially be maintained.

For example, the feedback loop 130 of the circuit 100 may be configured to counteract fluctuations of the phase of the output signal 115 of the oscillator 110.

In addition, the feedback loop 130 may be configured to attenuate a noise of the oscillator 110.

Here, it is to be noted that the fluctuations of the phase of the output signal 115 of the oscillator 110 and the noise of the oscillator 110 substantially represent different types of phase errors of the phase adjusted signal 125.

Furthermore, the circuit 100 comprises the following additional features.

Figure 2:
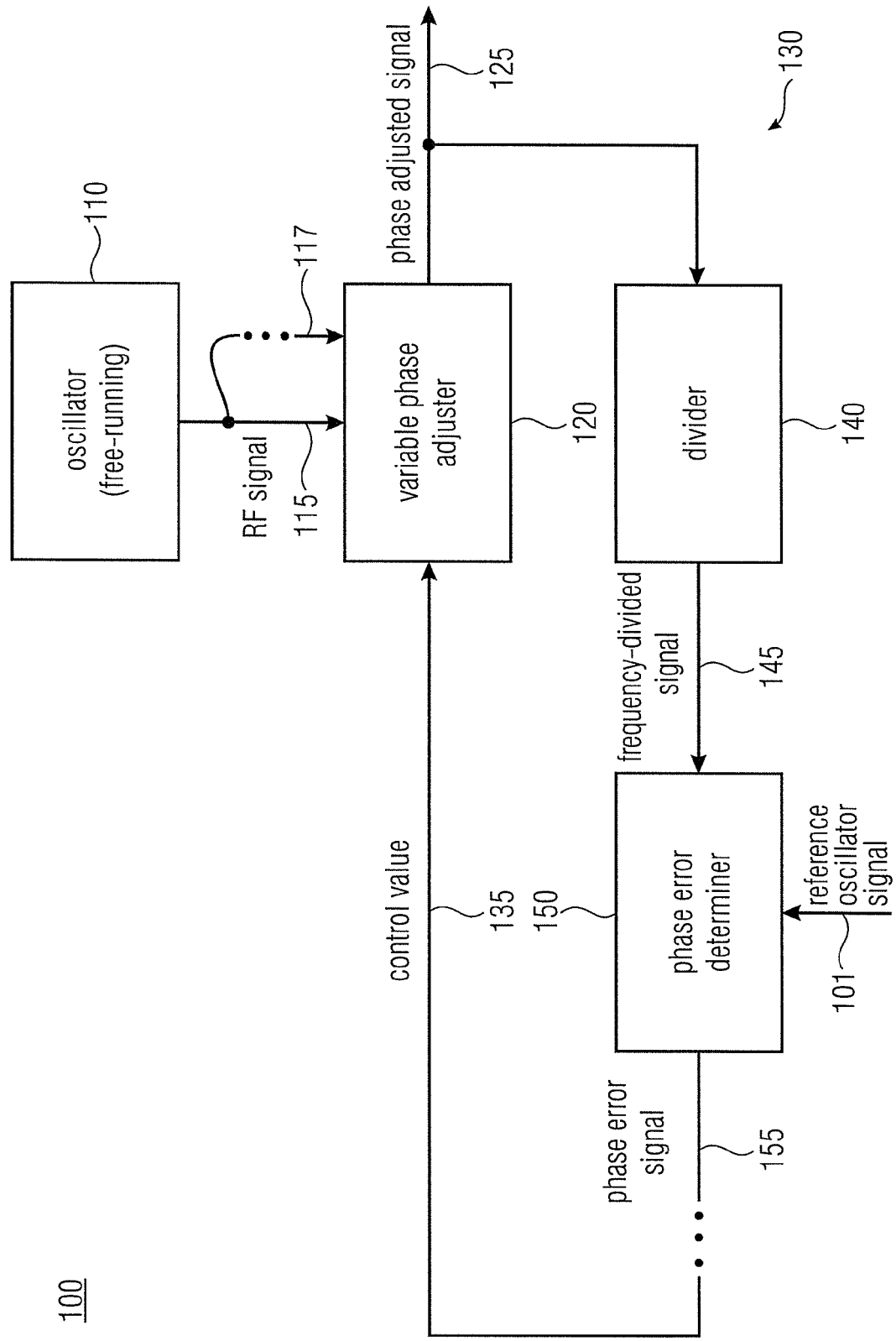
FIG. 2 shows a block diagram of an example implementation of the circuit shown in FIG. 1b comprising a divider and a phase error determiner.

FIG. 2 shows a block diagram of an example implementation of the circuit 100 shown in FIG. 1b comprising a divider 140 and a phase error determiner 150. For example, the feedback loop 130 of the circuit 100 comprises a divider 140 and a phase error determiner 150. The divider 140 is configured to provide a frequency-divided signal 145 using the phase adjusted signal 125. The phase error determiner 150 is configured to determine a phase error signal 155 based on the reference oscillator signal 101 and the frequency-divided signal 145. Furthermore, the feedback loop 130 is configured to provide the control value 135 for controlling the variable phase adjuster 120 using the determined phase error signal 155.

Figure 3:
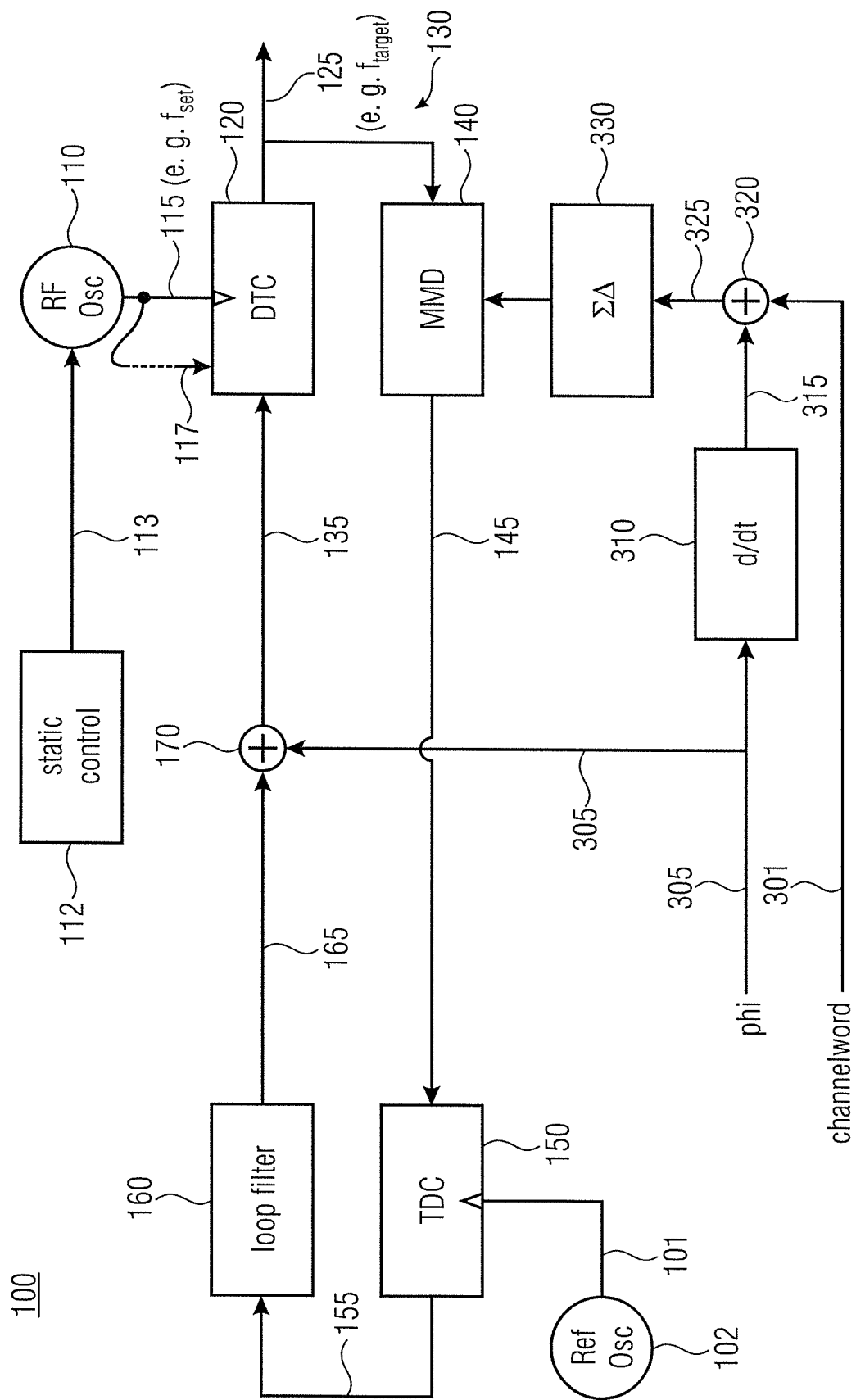
FIG. 3 shows a block diagram of an example circuit comprising a free-running oscillator and a digitally controlled phase shifting device (DTC)

FIG. 3 shows a block diagram of an example circuit 100 comprising a free-running oscillator 110 and a digitally controlled phase shifting device 120 (DTC). Referring to FIG. 3, the feedback loop 130 of the circuit 100 may further comprise a loop filter 160 and a combiner 170. The loop filter 160 is configured to filter the phase error signal 155 to obtain a filtered phase error signal 165. The combiner 170 is configured to combine the filtered phase error signal 165 and a phase modulation signal 305 to obtain a combined signal 135. Here, the combined signal 135 represents a modulation overlapped with the filtered phase error signal 165 for controlling the variable phase adjuster 120. Furthermore, the combined signal 135 at the output of the combiner 170 shown in FIG. 3 may describe the control value 135 provided by the feedback loop 130 shown in FIG. 2. In FIG. 3, the phase modulation signal 305 received by the combiner 170 is indicated by "phi". Furthermore, the combiner 170 of the feedback loop 130 may represent a first injection point of a two-point modulation scheme.

Further referring to FIG. 3, the circuit 100 may further comprise a modulator 330, a differentiator 310 and a further combiner 320. The modulator 330 is configured to control the divider 140 to modulate a frequency division characteristic of the divider 140 based on a modulator input signal 325. The differentiator 310 is configured to differentiate the phase modulation signal 305 to obtain a frequency modulation signal 315. The further combiner 320 is configured to combine the frequency modulation signal 315 and a frequency channelword 301 to obtain the modulator input signal 325. Here, the frequency channelword 301 may indicate a desired channel frequency of the phase adjusted signal 125. In FIG. 3, the divider 140 of the feedback loop 130, which is controlled by the modulator 330, may represent a second injection point of the two-point modulation scheme.

Therefore, the circuit 100 of FIG. 3 may substantially be based on a two-point modulation scheme. By the use of this two-point modulation scheme, it is possible to obtain a flexible implementation of the circuit 100.

In the circuit 100 of FIG. 3, the oscillator 110 denoted by "RF Osc" is controlled by an oscillator controller 112 denoted by "static control". For example, the oscillator controller 112 is configured to provide a tuning of a frequency of the RF signal 115 provided by the oscillator 110.

According to FIG. 3, the phase error determiner 150 of the circuit 100 may comprise a time-to-digital converter (TDC). For example, the time-to-digital converter (TDC) is configured to compare the reference oscillator signal 101 and the frequency-divided signal 145 and provide the phase error signal 155 in a digital form based on the comparison. For example, the TDC may be configured to measure a phase difference between the reference oscillator signal 101 provided by the reference oscillator 102 and the frequency-divided signal 145 provided by the divider 140.

As shown in FIG. 3, the reference oscillator signal 101 may be provided by a reference oscillator 102. The reference oscillator 102 of FIG. 3 is denoted by "Ref Osc".

Furthermore, the feedback loop 130 of the circuit 100 shown in FIG. 3 may be configured to provide the control value 135 as a digital control value. As shown in FIG. 3, the variable phase adjuster 120 may comprise a digitally controlled phase shifting device (DTC). The digitally controlled phase shifting device (DTC) is configured to delay the output signal 115 of the oscillator 110 or the signal 117 derived from the output signal 115 of the oscillator 110 by a variable time delay based on the digital control value 135 to obtain the phase adjusted signal 125.

Referring to FIG. 3, the divider 140 represents an adjustable divider, such as a multi-modulus divider ("MMD"), while the modulator 330 may, for example, be a sigma-delta modulator ("ΣΔ").

For example, the oscillator 110 of the circuit 100 may be configured to generate an unmodulated RF carrier signal 115 for the variable phase adjuster 120.

In addition, the oscillator 110 may be configured to provide the RF signal 115 comprising a set frequency ($f_{set}$). For example, the set frequency ($f_{set}$) lies within a predefined range around a target frequency ($f_{target}$) of the phase adjusted signal 125. The set frequency ($f_{set}$) is, for example, provided by the oscillator 110 before an operation of the feedback loop 130 starts.

As shown in FIG. 3, the circuit 100 may comprise the oscillator controller 112. Furthermore, the oscillator 110 shown in the circuit 100 of FIG. 3 is configured to be tunable. For example, the oscillator controller 112 is configured to provide a coarse tuning of a frequency of the RF signal 115. In addition, the oscillator controller 112 is configured to leave the coarse tuning unchanged during an operation of the feedback loop 130.

Further referring to FIG. 3, the oscillator controller 112 is configured to control the oscillator 110 using an oscillator control signal 113. Again, the oscillator 110 is configured to be tunable. For example, the oscillator controller 112 is configured to provide a tuning of a frequency of the RF signal 115 based on the oscillator control signal 113 comprising static control bits which are independent from a phase modulation signal. Accordingly, the oscillator controller 112 is denoted by "static control" in FIG. 3.

Figure 4:
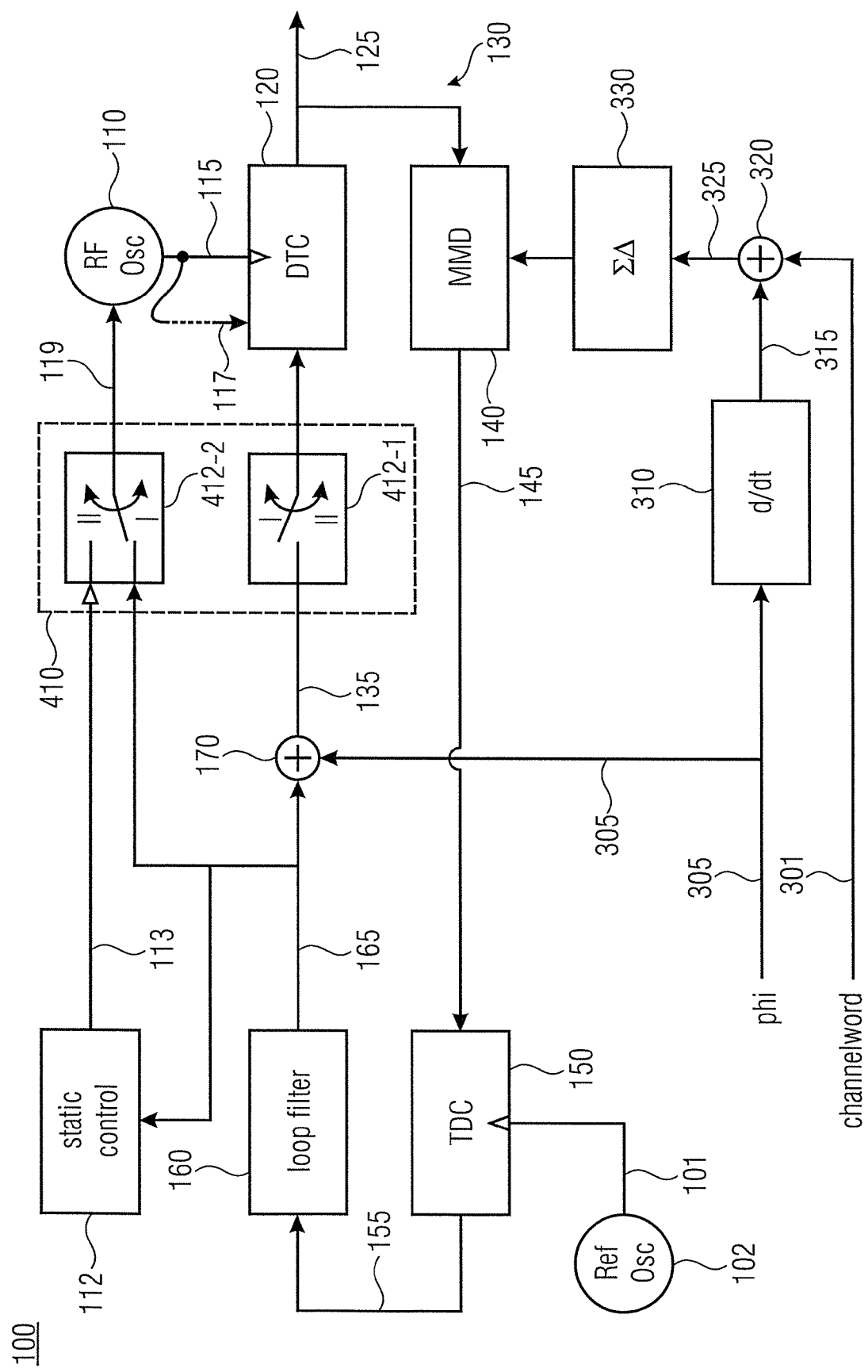
FIG. 4 shows a block diagram of an example circuit comprising a tunable oscillator and a switch configuration.

FIG. 4 shows a block diagram of an example circuit 100 comprising a tunable oscillator 110 and a switch configuration 410. The circuit 100 shown in FIG. 4 substantially corresponds to the circuit 100 shown in FIG. 3. Referring to FIG. 4, the circuit 100 may further comprise an oscillator controller 112 configured to control the oscillator 110 using an oscillator control signal 113. Here, the oscillator 110 is configured to be tunable. Furthermore, the circuit 100 shown in FIG. 4 may comprise a switch configuration 410 for switching from a first state (I) to a second state (II). As depicted in FIG. 4, the switch configuration 410 may comprise a first switch 412-1 and a second 412-2 each configured to switch between the first state indicated by I and the second state indicated by II. For example, in the first state I of the switch configuration 410, a feedback (e.g. the combined signal 135 output by the combiner 170) is disconnected from the variable phase adjuster 120 and the tunable oscillator 110 is connected to the feedback (e.g. the filtered phase error signal 165 output by the loop filter 160). In addition, in the second state II of the switch configuration 410, the feedback (e.g. the combined signal 135) is connected to the variable phase adjuster 120 and the tunable oscillator 110 is disconnected from the feedback (e.g. the filtered phase error signal 165) and connected to the oscillator controller 112 (such as to obtain the oscillator control signal 113). Furthermore, the circuit 100 shown in FIG. 4 is configured to provide, in the first state I of the switch configuration 410, a closed loop coarse tuning of a frequency of the RF signal 115 provided by the tunable oscillator 110 and to cause the tunable oscillator 110 to be locked to a desired frequency corresponding to a locked state of the tunable oscillator 110. In addition, the oscillator controller 112 is configured to provide, in the second state II of the switch configuration 410, the oscillator control signal 113 using a feedback loop output value (such as derived from the filtered phase error signal 165) previously stored in the locked state of the tunable oscillator 110.

By the use of the switch configuration 410, the circuit 100 first locks the tunable oscillator 110 to the desired frequency (locked state) and then the oscillator controller 112 controls the oscillator 110 (in the free-running mode of operation) using the previously stored feedback loop output value obtained from the locked state.

Figure 5:
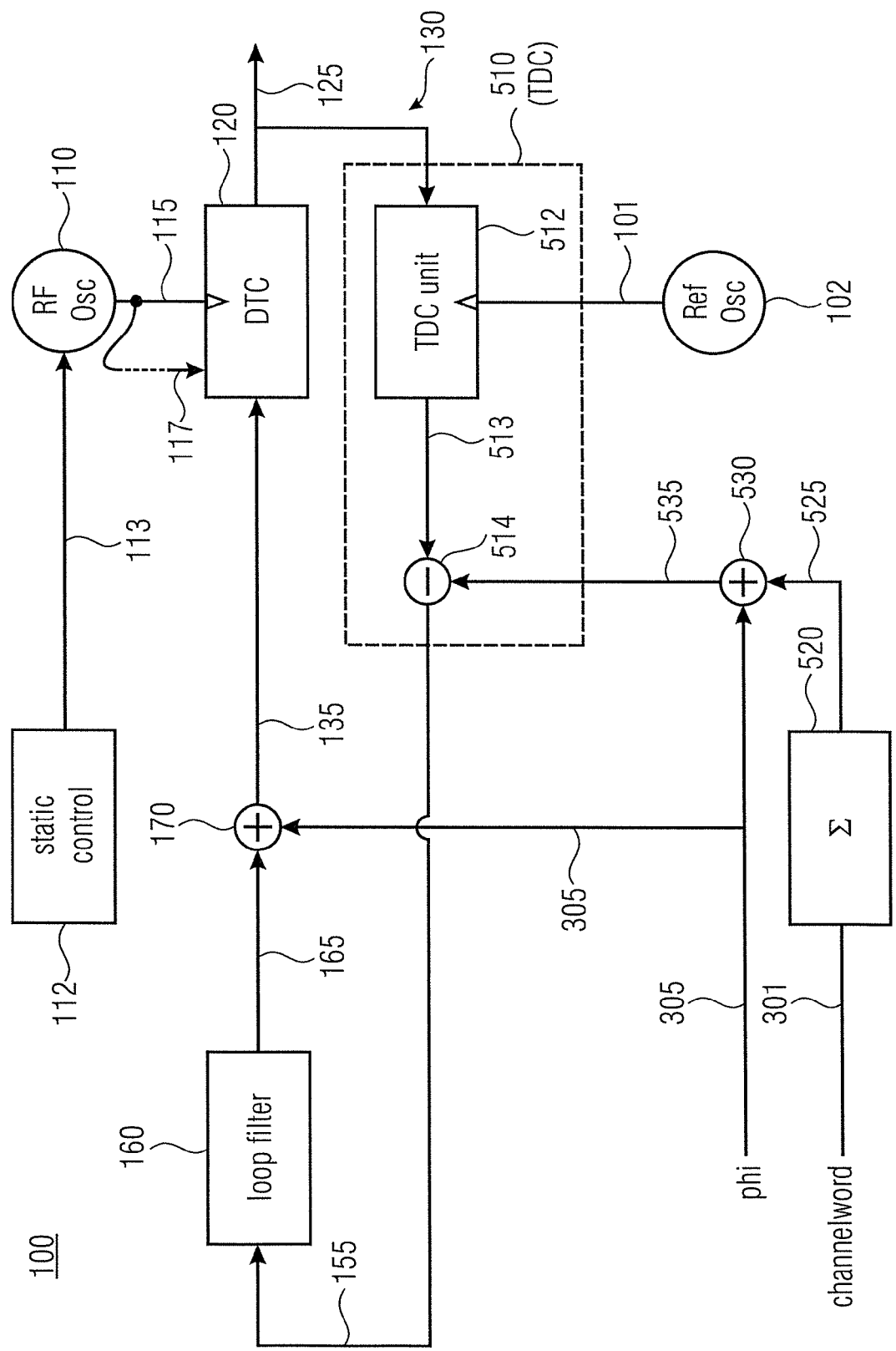
FIG. 5 shows a block diagram of an example circuit comprising a time-to-digital converter (TDC) which is used for a direct phase measurement.

FIG. 5 shows a block diagram of an example circuit 100 comprising a time-to-digital converter 510 (TDC) which is used for a direct phase measurement. As shown in FIG. 5, the feedback loop 130 of the circuit 100 may comprise a time-to-digital converter 510 (TDC). For example, the time-to-digital converter 510 (TDC) is configured to directly measure a phase of the phase adjusted signal 125 using the reference oscillator signal 101 and provide a phase error signal 155 based on a result 513 of the phase measurement and a target phase value 535. In addition, the feedback loop 130 may be configured to provide the control value 135 for controlling the variable phase adjuster 120 (e.g. in the form of a digitally controlled phase shifting device, DTC) using the phase error signal 155. In FIG. 5, the feedback loop 130 may comprise the loop filter 160 and the combiner 170 shown in the circuit 100 of FIG. 3. Furthermore, the circuit 100 of FIG. 5 comprises the oscillator controller 112 denoted by "static control" and the oscillator 110 denoted by "RF Osc" of FIG. 3.

As opposed to the circuit 100 shown in FIG. 3, the TDC 510 of the circuit 100 shown in FIG. 5 is operative to directly receive the phase adjusted signal 125. In addition, the TDC 510 is configured to provide the phase error signal 155 based on the directly received phase adjusted signal 125. In other words, the feedback loop 130 of FIG. 5 does not include a divider which is operative on the phase adjusted signal 125. As shown in FIG. 5, the TDC 510 may comprise a TDC unit 512 and a comparator 514 (or combiner). For example, the TDC unit 512 may be configured to perform the phase measurement on the phase adjusted signal 125 for obtaining the result 513 of the phase measurement (e.g. a signal describing the actual phase of the phase adjusted signal 125). Here, the TDC unit 512 uses the reference oscillator signal 101 provided by the reference oscillator 102 as a reference for the phase measurement. In addition, the comparator 514 may be configured to compare the signal describing the target phase value 535 and the signal describing the actual phase value 513 to provide the phase error signal 155 that describes the difference between the actual phase value 513 and the target phase value 535.

Referring to FIG. 5, the time-to-digital converter 510 (TDC) is configured to receive the target phase value 535 which is provided based on a phase modulation signal 305 and an accumulated frequency channelword 525. For example, the circuit 100 shown in FIG. 5 may comprise a further combiner 530 configured to combine the phase modulation signal 305 and the accumulated frequency channelword 525 to provide the signal describing the target phase value 535. Furthermore, the circuit 100 may comprise an accumulator 520 ("Σ") configured to accumulate (or integrate) the frequency channelword 301 to obtain a signal in the phase domain describing the accumulated frequency channelword 525.

In comparison to the circuit 100 shown in FIG. 3, the circuit 100 shown in FIG. 5 may comprise a different two-point modulation scheme, wherein the combiner 170 may represent a first injection point of the two-point modulation scheme for the phase modulation signal 305 before the DTC 120, while the comparator 514 may represent a second injection point for the signal describing the target phase value 535 after the TDC unit 512.

Referring again to FIG. 3, the circuit 100 comprises an oscillator 110, a digitally controlled phase shifting device 120 (DTC) and a feedback loop 130. The oscillator 110 is configured to provide an RF signal 115. Here, the oscillator 110 is configured to operate in a free-running mode of operation. The digitally controlled phase shifting device 120 (DTC) is configured to delay the output signal 115 of the oscillator 110 or the signal 117 derived from the output signal 115 of the oscillator 110 by a variable time delay based on a digital control value 135 to obtain a phase adjusted signal 125. The feedback loop 130 comprises a divider 140, a time-to-digital converter 150 (TDC) and a loop filter 160. The divider 140 is configured to provide a frequency-divided signal 145 using the phase adjusted signal 125. The time-to-digital converter 150 (TDC) is configured to compare the reference oscillator signal 101 and the frequency-divided signal 145 and to provide a phase error signal 155 in a digital form based on the comparison. The loop filter 160 is configured to filter the phase error signal 155 to obtain a filtered phase error signal 165. The feedback loop 130 is configured to provide the digital control value 135 for the digitally controlled phase shifting device 120 (DTC) using the filtered phase error signal 165.

In summary, FIG. 3 shows a feedback loop 130 (or phase locked loop, PLL) based modulator structure. This structure of FIG. 3 is characterized in that the RF oscillator 110 is placed outside the loop 130. In this structure, the free-running RF oscillator 110 generates the unmodulated carrier signal 115. For example, the DTC 120 shifts the phase of the carrier signal 115 depending on the digital input (e.g. a digital control value 135) which is a sum of the loop filter output 165 and the phase modulation signal 305.

By using this structure, it is possible that the noise and phase drift introduced by the free-running oscillator 110 is attenuated by the feedback loop 130 or PLL. Since the entry point of the noise into the feedback loop or PLL is exactly the same as it would be with the oscillator inside the loop (as known from conventional PLLs), the noise attenuation of the feedback loop or PLL is also a highpass function.

In order to limit the frequency error the DTC 120 has to compensate for, the oscillator 110 may be set close to the target frequency (e.g. $f_{set} \approx f_{target}$) before the operation of the feedback loop 130 or PLL starts. Once the feedback loop 130 or PLL is operating, this coarse tuning does not have to be updated. Therefore, it has been found that this tuning can be performed with static control bits. It has also been found that linearity of this tuning is substantially no issue, which makes a circuit implementation rather easy.

For a wideband phase modulation, the two-point modulation scheme (described exemplarily with reference to FIG. 3) can be used.

The DTC input 135 is typically provided in the phase domain, so that the phase signal 305 can be added directly to the loop filter output 165. For the second input at the multi-modulus divider 140, a differentiation (at block 310) may be performed first to transform from the phase domain to the frequency domain. Since the gain and the delay of the DTC 120 as well as the gain of the multi-modulus divider 140 are usually defined very well, the matching of the two modulation paths (corresponding to the first and the second injection points of the two-point modulation scheme) can be achieved easier than with a conventional PLL structure.

An advantage of the circuit 100 is that the RF oscillator 110 can be implemented without the need of any fine tuning. This greatly eases the circuit design of the oscillator 110 and allows a design optimized for low power consumption. Additionally, as the oscillator 110 does not need any dynamic tuning device, it will be very insensitive to disturbances from other blocks on the chip or from its environment, which might create spurs in the output spectrum. Furthermore, it has been found that the calibration phase for measuring the tuning gain will no longer be needed in some cases, which substantially saves time for the feedback loop or PLL power up. In other cases, the calibration of the DTC may additionally be performed.

Basically, the structure of FIG. 3 is realized by using a feedback loop 130 (or phase locked loop) with the RF oscillator 110 being placed outside the loop 130. It has been found that as the actuating element of the feedback loop or PLL control loop, a digital-to-time convertor can be used. The DTC may delay the free-running oscillator signal by a programmable value of time. The DTC output phase 125 may be divided by the multi-modulus divider 140, measured by the TDC 150 and fed back to the DTC input 135 through the loop filter 160.

Furthermore, a phase modulator based on this feedback loop or PLL can be built by adding the phase modulation signal 305 to the loop filter output 165 and additionally, after differentiation (e.g. at block 310), to the frequency channelword 301 which is fed to a sigma-delta modulator 330 controlling a multi-modulus divider 140.

Referring again to FIG. 4, a feedback loop or PLL structure with a closed loop coarse tuning of the RF oscillator is shown. In the structure of FIG. 4, the second switch 412-2 is placed before the oscillator coarse tuning input 119 that allows feeding the loop filter output 165 to the RF oscillator tuning input 119 in order to perform a closed loop coarse tuning of the oscillator 110. In this position, the first switch 412-1 provided before the DTC 120 is opened so that the DTC 120 will not modulate the oscillator output signal 115. Once the oscillator 110 is locked to the wanted frequency (e.g. $f_{target}$), the RF oscillator input 119 is switched to the static control 112 (by the second switch 412-2) which stores the last loop filter output value (e.g. derived from the loop filter output 165), and the first switch 412-1 before the DTC 120 is closed. Then, the oscillator 110 is again running freely, and the loop 130 is closed through the DTC 120.

Referring again to FIG. 5, an alternative feedback loop (or phase locked loop, PLL) based phase modulator without a divider in the feedback path is shown. As compared to the structure of FIG. 3, the difference is that the structure of FIG. 5 does not use a divider in the feedback path, but instead directly measures the DCO phase with the TDC unit 512. For building a phase modulator, the second modulation input point (e.g. corresponding to the comparator 514) is provided after the TDC unit 512. Since this is in the phase domain, the frequency channelword is accumulated before it is compared with the TDC output 513.

It is pointed out that additional modifications/extensions of the previously described structures can be employed. For example, it is possible to place a divider between the RF oscillator 110 and the DTC 120, so that the DTC 120 will receive the divided oscillator signal at its input. Here, the divided oscillator signal at the input of the DTC 120 may correspond to the signal 117 derived from the output signal 115 of the oscillator 110.

In addition, it is possible to provide different clock rates for the modulation signal and the feedback loop or PLL reference oscillator 102. This may require a downsampling of the phase modulation signal 305 before connecting it to the multi-modulus divider 140 and upsampling of the loop filter output signal 165 to the modulation data rate before it is added to the modulation data 305.

In addition, the RF oscillator 110 could provide multiple phases of the RF oscillating signal 115, and the DTC 120 only selects one of the these phases (e.g., acting as a switch).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the methods steps may be executed by (or using) a hardware apparatus like, for example, a microprocessor, a programmable computer or an electronic circuit. In some examples, some one or more of the most important method steps may be executed by such an apparatus.

Accordingly, a method comprises providing an RF signal 115 by an oscillator 110, wherein the oscillator 110 is configured to operate in a free-running mode of operation, providing a phase adjusted signal 125, a phase of which is shifted with respect to a phase of an output signal 115 of the oscillator 110, or with respect to a phase of a signal 117 derived from the output signal 115 of the oscillator 110. The method further comprises using a variable phase adjustment and providing a control value 135 for controlling the variable phase adjustment based on the phase adjusted signal 125 and a reference oscillator signal 101 to counteract a phase error of the phase adjusted signal 125.

Furthermore, providing the control value 135 for controlling the variable phase adjustment may comprise counteracting fluctuations of the phase of the output signal 115 of the oscillator 110.

Although each claim only refers back to one single claim, the disclosure also covers any conceivable combination of claims.

The present circuit allows to avoid the nonlinearity/gain variation problem occurring in the prior art. This can substantially be achieved by using a feedback loop or digital PLL (DPLL) without having the oscillator in the loop. By using the feedback loop or PLL, it is possible to attenuate the oscillator in-band noise by a negative feedback of the output phase error measured by a phase detector or time-to-digital converter (TDC). However, it has been found that the oscillator does not have to be in the loop to achieve this when, for example, a digitally controlled phase shifting device (a DTC) is available.

What is claimed is:
1. A circuit, comprising:
an oscillator configured to provide a radio frequency (RF) signal as an output signal of the oscillator, wherein the oscillator is configured to operate in a free-running mode of operation;
a variable phase adjuster configured to provide a phase adjusted signal derived from the output signal and having a phase that is shifted with respect to a phase of the output signal;
a feedback loop configured to provide a control value for controlling the variable phase adjuster based on the phase adjusted signal and a reference oscillator signal to counteract a phase error of the phase adjusted signal;
wherein the feedback loop comprises a divider and a phase error determiner;
wherein the divider is configured to provide a frequency-divided signal using the phase adjusted signal;
wherein the phase error determiner is configured to determine a phase error signal based on the reference oscillator signal and the frequency-divided signal; and
wherein the feedback loop is configured to provide the control value for controlling the variable phase adjuster using the determined phase error signal.

2. The circuit according to claim 1, wherein a phase of the phase adjusted signal is shifted with respect to a phase of the output signal of the oscillator, or with respect to a phase of a signal derived from the output signal of the oscillator.

3. The circuit according to claim 1, wherein the feedback loop is configured to counteract fluctuations of the phase of the output signal of the oscillator.

4. The circuit according to claim 1, wherein the feedback loop is configured to attenuate a noise of the oscillator.

5. The circuit according to claim 1,
wherein the feedback loop further comprises a loop filter and a combiner;
wherein the loop filter is configured to filter the phase error signal to obtain a filtered phase error signal;
wherein the combiner is configured to combine the filtered phase error signal and a phase modulation signal to obtain a combined signal; and
wherein the combined signal represents a modulation overlapped with the filtered phase error signal for controlling the variable phase adjuster.

6. The circuit according to claim 5, further comprising:
a modulator configured to control the divider to modulate a frequency division characteristic of the divider based on a modulator input signal;

a differentiator configured to differentiate the phase modulation signal to obtain a frequency modulation signal; and a further combiner configured to combine the frequency modulation signal and a frequency channelword to obtain the modulator input signal;

wherein the frequency channelword indicates a desired channel frequency of the phase adjusted signal.

7. The circuit according to claim 1,
wherein the phase error determiner comprises a time-to-digital converter (TDC); and
wherein the time-to-digital converter (TDC) is configured to compare the reference oscillator signal and the frequency-divided signal and to provide the phase error signal in a digital form based on the comparison.

8. The circuit according to claim 1,
wherein the feedback loop is configured to provide the control value as a digital control value;
wherein the variable phase adjuster comprises a digitally controlled phase shifting device (DTC); and
wherein the digitally controlled phase shifting device (DTC) is configured to delay the output signal of the oscillator or the signal derived from the output signal of the oscillator by a variable time delay based on the digital control value to obtain the phase adjusted signal.

9. The circuit according to claim 1, wherein the oscillator is configured to generate an unmodulated RF carrier signal for the variable phase adjuster.

10. The circuit according to claim 1,
wherein the oscillator is configured to provide the RF signal comprising a set frequency;
wherein the set frequency lies within a predefined range around a target frequency of the phase adjusted signal; and
wherein the set frequency is provided by the oscillator before an operation of the feedback loop starts.

11. The circuit according to claim 1, further comprising an oscillator controller,
wherein the oscillator is configured to be tunable;
wherein the oscillator controller is configured to provide a coarse tuning of a frequency of the RF signal; and
wherein the oscillator controller is configured to leave the coarse tuning unchanged during an operation of the feedback loop.

12. The circuit according to claim 1, further comprising:
an oscillator controller configured to control the oscillator using an oscillator control signal;
wherein the oscillator is configured to be tunable; and
wherein the oscillator controller is configured to provide a tuning of a frequency of the RF signal based on the oscillator control signal comprising static control bits which are independent from a phase modulation signal.

13. The circuit according to claim 1, further comprising:
an oscillator controller configured to control the oscillator using an oscillator control signal, wherein the oscillator is configured to be tunable; and
a switch configuration configured to switch from a first state to a second state;
wherein in the first state of the switch configuration, a feedback is disconnected from the variable phase adjuster and the tunable oscillator is connected to the feedback;
wherein in the second state of the switch configuration, the feedback is connected to the variable phase adjuster and the tunable oscillator is disconnected from the feedback and connected to the oscillator controller;

wherein the circuit is configured to provide, in the first state of the switch configuration, a closed loop coarse tuning of a frequency of the RF signal provided by the tunable oscillator and cause the tunable oscillator to be locked to a desired frequency corresponding to a locked state of the tunable oscillator; and
wherein the oscillator controller is configured to provide, in the second state of the switch configuration, the oscillator control signal using a feedback loop output value previously stored in the locked state of the tunable oscillator.

14. A circuit, comprising:
an oscillator configured to provide a radio frequency (RF) signal as an output signal of the oscillator, wherein the oscillator is configured to operate in a free-running mode of operation;
a variable phase adjuster configured to provide a phase adjusted signal derived from the output signal and having a phase that is shifted with respect to a phase of the output signal;
a feedback loop configured to provide a control value for controlling the variable phase adjuster based on the phase adjusted signal and a reference oscillator signal to counteract a phase error of the phase adjusted signal;
wherein the feedback loop comprises a time-to-digital converter (TDC);
wherein the time-to-digital converter (TDC) is configured to measure a phase of the phase adjusted signal using the reference oscillator signal and provide a phase error signal based on a result of the phase measurement and a target phase value; and
wherein the feedback loop is configured to provide the control value for controlling the variable phase adjuster using the phase error signal.

15. The circuit according to claim 14, wherein the time-to-digital converter (TDC) is configured to receive the target phase value which is provided based on a phase modulation signal and an accumulated frequency channelword.

16. A circuit, comprising:
an oscillator configured to provide a radio frequency signal, wherein the oscillator is configured to operate in a free-running mode of operation;
a digitally controlled phase shifting device (DTC) configured to delay the output signal of the oscillator or the signal derived from the output signal of the oscillator by a variable time delay based on a digital control value to obtain a phase adjusted signal;
a feedback loop comprising a divider, a time-to-digital converter (TDC) and a loop filter;
wherein the divider is configured to provide a frequency-divided signal using the phase adjusted signal;
wherein the time-to-digital converter (TDC) is configured to compare the reference oscillator signal and the frequency-divided signal and provide a phase error signal in a digital form based on the comparison;
wherein the loop filter is configured to filter the phase error signal to obtain a filtered phase error signal; and
wherein the feedback loop is configured to provide the digital control value for the digitally controlled phase shifting device (DTC) using the filtered phase error signal.

17. A mobile communication device, comprising:
an antenna port;
a circuit comprising:
an oscillator configured to provide a radio frequency (RF) signal, wherein the oscillator is configured to operate in a free-running mode of operation;

a variable phase adjuster configured to provide a phase adjusted signal derived directly from the RF signal provided by the oscillator and having a phase that is shifted with respect to a phase of the RF signal;

a feedback loop configured to provide a control value for controlling the variable phase adjuster; wherein the feedback loop comprises a divider and a phase error determiner, the divider is configured to provide a frequency divided signal using the phase adjusted signal, the phase error determiner is configured to determine a phase error signal based at least partially on the phase adjusted signal, and wherein the feedback loop is configured to provide the control value using the determined phase error signal; and a digital baseband processor;

wherein the circuit is coupled between the antenna port and the digital baseband processor.

18. The mobile communication device according to claim 17, wherein a phase of the phase adjusted signal is shifted with respect to a phase of an output signal of the oscillator, or with respect to a phase of a signal derived from the output signal of the oscillator.

19. The circuit according to claim 17, wherein the feedback loop is configured to counteract fluctuations of the phase of the output signal of the oscillator.

20. A method, comprising:

providing a radio frequency signal by an oscillator configured to operate in a free-running mode of operation;

providing a frequency-divided signal by a divider using a phase adjusted signal;

determining a phase error signal based on the frequency-divided signal;

determining a control value using the determined phase error signal; and providing the phase adjusted signal derived from the radio frequency signal according to the control value and having a phase that is shifted with respect to a phase of the radio frequency signal.

21. The method according to claim 20, further comprising:

counteracting fluctuations of the phase of the output signal of the oscillator with the control value for controlling the variable phase adjustment.

\* \* \* \* \*